US011989427B2

(12) United States Patent
Bedeschi

(10) Patent No.: US 11,989,427 B2
(45) Date of Patent: May 21, 2024

(54) TRANSISTOR CONFIGURATIONS FOR VERTICAL MEMORY ARRAYS

(71) Applicant: Micron Technology, Inc., Boise, ID (US)

(72) Inventor: Ferdinando Bedeschi, Biassono (IT)

(*) Notice: Subject to any disclaimer, the term of this patent is extended or adjusted under 35 U.S.C. 154(b) by 0 days.

(21) Appl. No.: 17/823,371

(22) Filed: Aug. 30, 2022

(65) Prior Publication Data
US 2023/0393766 A1 Dec. 7, 2023

Related U.S. Application Data

(60) Provisional application No. 63/365,683, filed on Jun. 1, 2022.

(51) Int. Cl.
*G06F 3/06* (2006.01)
(52) U.S. Cl.
CPC .......... *G06F 3/0625* (2013.01); *G06F 3/0629* (2013.01); *G06F 3/0673* (2013.01)
(58) Field of Classification Search
CPC .... G06F 3/0625; G06F 3/0673; G06F 3/0629; G06F 3/06
See application file for complete search history.

(56) References Cited

U.S. PATENT DOCUMENTS

| | | | | |
|---|---|---|---|---|
| 2013/0069137 A1* | 3/2013 | Pekny | ............... | H01L 29/40117 257/E27.06 |
| 2015/0129955 A1* | 5/2015 | Mueller | .............. | H01L 27/0207 257/329 |
| 2016/0141337 A1* | 5/2016 | Shimabukuro | .... | H10N 70/8845 365/51 |
| 2017/0255410 A1* | 9/2017 | Shiga | ..................... | G11C 16/10 |
| 2020/0027511 A1* | 1/2020 | Futatsuyama | .......... | G11C 16/08 |
| 2020/0202914 A1* | 6/2020 | Sakhare | .............. | G11C 11/1673 |
| 2021/0091108 A1* | 3/2021 | Naruke | .................. | G11C 16/24 |
| 2022/0285367 A1* | 9/2022 | Fackenthal | ..... | H01L 21/823871 |
| 2023/0307042 A1* | 9/2023 | Bedeschi | ........... | G11C 13/0026 |

FOREIGN PATENT DOCUMENTS

| | | | | |
|---|---|---|---|---|
| WO | WO-2021240203 A1 * | 12/2021 | ......... | G11C 13/0004 |
| WO | WO-2022187780 A1 * | 9/2022 | ..... | H01L 21/823871 |

OTHER PUBLICATIONS

J.-W. Han et al., "Surround Gate Transistor With Epitaxially Grown Si Pillar and Simulation Study on Soft Error and Rowhammer Tolerance for DRAM," in IEEE Transactions on Electron Devices, vol. 68, No. 2, pp. 529-534, Feb. 2021.*

* cited by examiner

*Primary Examiner* — Pierre Michel Bataille
(74) *Attorney, Agent, or Firm* — Holland & Hart LLP

(57) ABSTRACT

Methods, systems, and devices for transistor configurations for vertical memory arrays are described. A memory device may implement a multi-transistor architecture, such as a two-transistor architecture, that is operable to couple pillars with bit lines. For example, a memory device may include a conductive pillar that extends through levels of a memory array. The pillar may be coupled with a first bit line via a first transistor and coupled with a second bit line via a second transistor. To access a memory cell coupled with the pillar, the memory device may bias a word line coupled with the memory cell to a first access voltage, bias one of the bit lines to a second access voltage, activate one of the transistors to couple the pillar with the one of the bit lines, and deactivate the other transistor to isolate the pillar from the other of the bit lines.

25 Claims, 8 Drawing Sheets

SECTION A-A

Unselected Memory Cell 105    Selected Memory Cell 105-a

TRANSISTOR CONFIGURATIONS FOR VERTICAL MEMORY ARRAYS

CROSS REFERENCE

The present Application for Patent claims the benefit of U.S. Provisional Patent Application No. 63/365,683 by BEDESCHI, entitled "TRANSISTOR CONFIGURATIONS FOR VERTICAL MEMORY ARRAYS," filed Jun. 1, 2022, assigned to the assignee hereof, and expressly incorporated by reference herein.

FIELD OF TECHNOLOGY

The following relates to one or more systems for memory, including transistor configurations for vertical memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
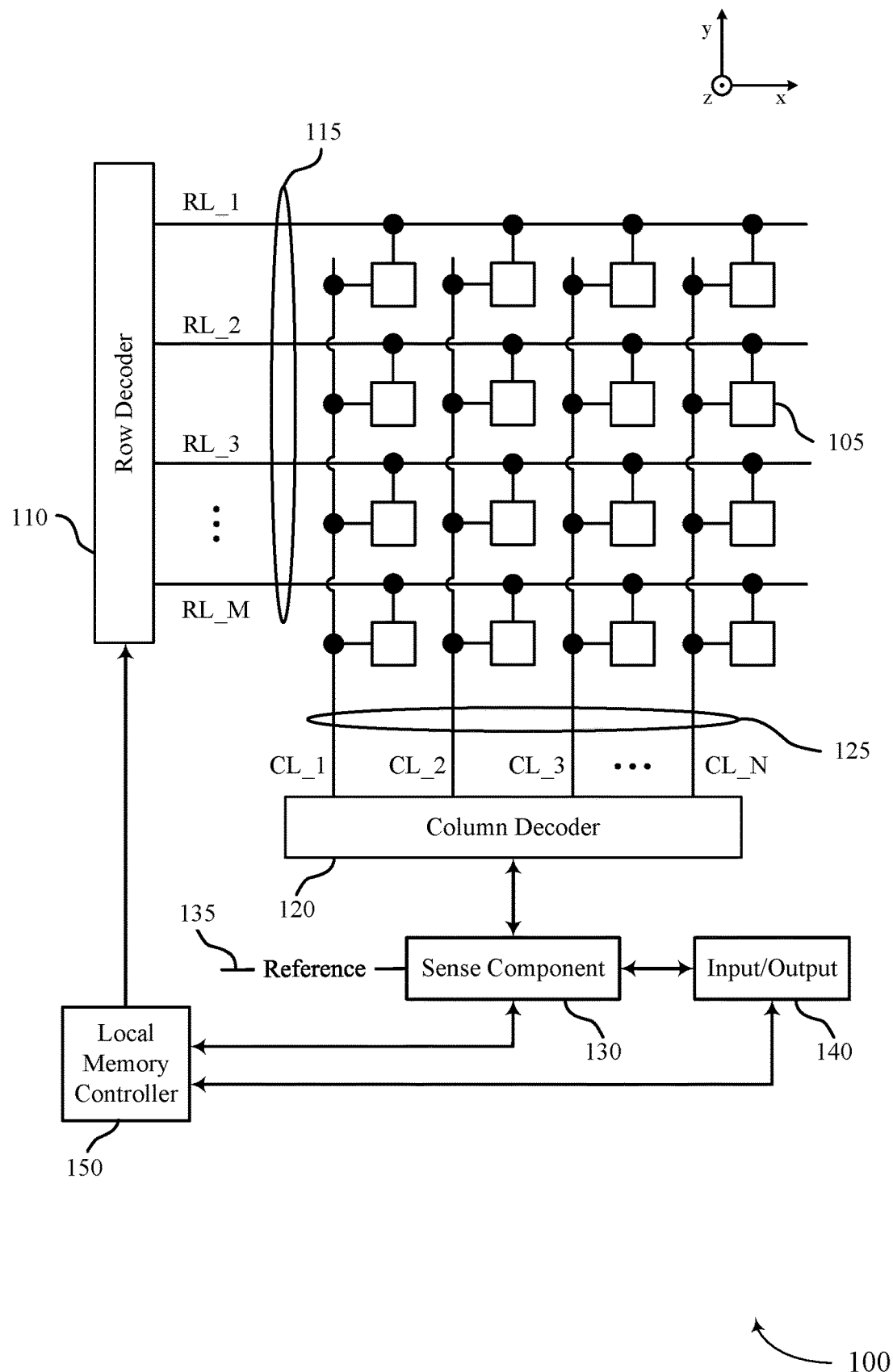
FIG. 1 illustrates an example of a memory array that supports transistor configurations for vertical memory arrays in accordance with examples as disclosed herein.

In some memory architectures, a memory device may include a memory array arranged in a vertical architecture, such as a three-dimensional architecture, that includes memory cells arranged according to different levels (e.g., layers, decks, planes, tiers). In some such architectures, a memory cell may be coupled with (e.g., coupled physically between, electrically between, or both) a word line and a conductive pillar that extends through the levels of the memory array. To access the memory cell, the memory device may include circuitry configured to bias the word line and the conductive pillar to respective voltages such that a bias is applied across the memory cell. A logic state may be written to the memory cell based on a current driven through the memory cell (e.g., an amount of current, a direction of current) as a result of the bias applied across the memory cell. A logic state may be read from the memory cell based on a current (e.g., a presence of current, an absence of current, an amount of current) through the memory cell based on or in response to the bias applied across the memory cell.

To bias a conductive pillar in accordance with an access operation of a selected memory cell, the memory device may be configured to couple the conductive pillar (e.g., a first conductive pillar, a pillar coupled with the selected memory cell) with a bit line while isolating other conductive pillars (e.g., one or more second conductive pillars) from the bit line, which may prevent or reduce a biasing across unselected memory cells. For example, the memory device may activate a first transistor between the first conductive pillar and the bit line to couple the conductive pillar with the bit line, thereby biasing the conductive pillar with a voltage of the bit line. The memory device may deactivate a second transistor between a second conductive pillar and the bit line to decouple the second conductive pillar from the bit line. In some cases, the memory device may deactivate the second transistor by biasing a gate of the second transistor to a negative voltage, which may result in a relatively large voltage differential across the second transistor (e.g., a gate-to-source differential, a drain-to-source differential). For example, if the bit line is biased to a positive voltage +V according to the access operation and the gate of the second transistor is biased to a negative voltage −V, a voltage differential having a magnitude of 2V may result across the second transistor. In some cases, such a voltage differential may be associated with leakage (e.g., charge leakage, current leakage, leakage between circuit elements intended to be isolated from one another) at the second transistor, which may disrupt the access operation (e.g., alter a voltage of the bit line or a current along the bit line, which may increase a latency of the access operation or cause the access operation to fail), increase power consumption, or both.

In accordance with examples as disclosed herein, a memory device may implement a multi-transistor architecture, such as a two-transistor architecture, that is operable to couple a given conductive pillar with a set (e.g., a pair, one or more) of bit lines, which may reduce voltage differentials across respective transistors, thereby reducing leakage. For example, a memory device may include a conductive pillar that may be coupled with a first bit line via a first transistor and coupled with a second bit line via a second transistor. In some examples, to bias the conductive pillar with a positive voltage (e.g., +V), the memory device may be configured to bias the first bit line to +V, activate the first transistor to couple the conductive pillar with the first bit line, and deactivate the second transistor to isolate the conductive pillar from the second bit line. In some examples, to bias the conductive pillar with a negative voltage (e.g., −V), the memory device may be configured to bias the second bit line to −V, activate the second transistor to couple the conductive pillar with the second bit line, and deactivate the first transistor to isolate the conductive pillar from the first bit line. By using different bit lines to positively and negatively bias conductive pillars, voltage differentials across deactivated transistors may be reduced, thereby reducing leakage associated with the deactivated transistors. For example, the bit lines and respective gates of the deactivated transistors may be biased such that respective voltage differentials across the deactivated transistors may have magnitudes between 0 and V during an access operation (e.g., rather than a voltage differential having a potential magnitude of 2V that may occur in a single-transistor implementation). Thus, by implementing the multi-transistor architecture, such as the two-transistor architecture, to bias conductive pillars of a memory device in accordance with examples as disclosed herein, a memory device may be implemented with reduced leakage through deactivated transistors, which may support reduced power consumption, increased accuracy of access operations, or any combination thereof, among other benefits.

Features of the disclosure are initially described in the context of memory devices and arrays with reference to FIGS. 1, 2, 3A, and 3B. Features of the disclosure are described in the context of example layouts with reference to FIGS. 4-6. These and other features of the disclosure are further illustrated by and described with reference to an apparatus diagram and flowcharts that relate to transistor configurations for vertical memory arrays as described with reference to FIGS. 7 and 8.

FIG. 1 illustrates an example of a memory device 100 that supports transistor configurations for vertical memory arrays in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In some examples of the memory device 100, the memory cells 105 may be arranged in a three-dimensional architecture according to different levels (e.g., along the illustrative z-direction). In some such architectures, a memory cell 105 may be coupled between an access line and a conductive pillar that extends through the levels of memory cells 105. To access the memory cell 105, circuitry (e.g., a row decoder 110, a column decoder 120, or another type of decoder) may be configured to bias the access line and the conductive pillar to respective voltages such that a bias is applied across the memory cell 105. A logic state may be written to the memory cell 105 based on a current driven through the memory cell 105 (e.g., an amount of current, a direction of current) as a result of the bias applied across the memory cell 105. A logic state may be read from the memory cell 105 based on a current (e.g., a presence of current, an absence of current, an amount of current) through the memory cell 105 based on or in response to the bias applied across the memory cell 105.

In accordance with examples as disclosed herein, the memory device 100 may implement a multi-transistor architecture, such as a two-transistor architecture, to couple conductive pillars with respective access lines (e.g., each associated with a different voltage polarity), which may reduce voltage differentials associated with leakage across the transistors. For example, the memory device 100 may include a conductive pillar that may be coupled with a first access line (e.g., associated with a positive voltage) via a first transistor and coupled with a second access line (e.g., associated with a negative voltage) via a second transistor. By using different access lines to positively and negatively bias conductive pillars via different transistors, voltage differentials across deactivated transistors may be reduced, thereby reducing leakage (e.g., associated with deactivated transistors). Thus, by implementing a multi-transistor architecture, such as a two-transistor architecture, to bias conductive pillars of the memory device 100 in accordance with examples as disclosed herein, the memory device 100 may support reduced power consumption, increased accuracy of access operations, or any combination thereof, among other benefits relative to some single-transistor architectures.

The memory device 100 may include any quantity of non-transitory computer readable media that support transistor configurations for vertical memory arrays. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
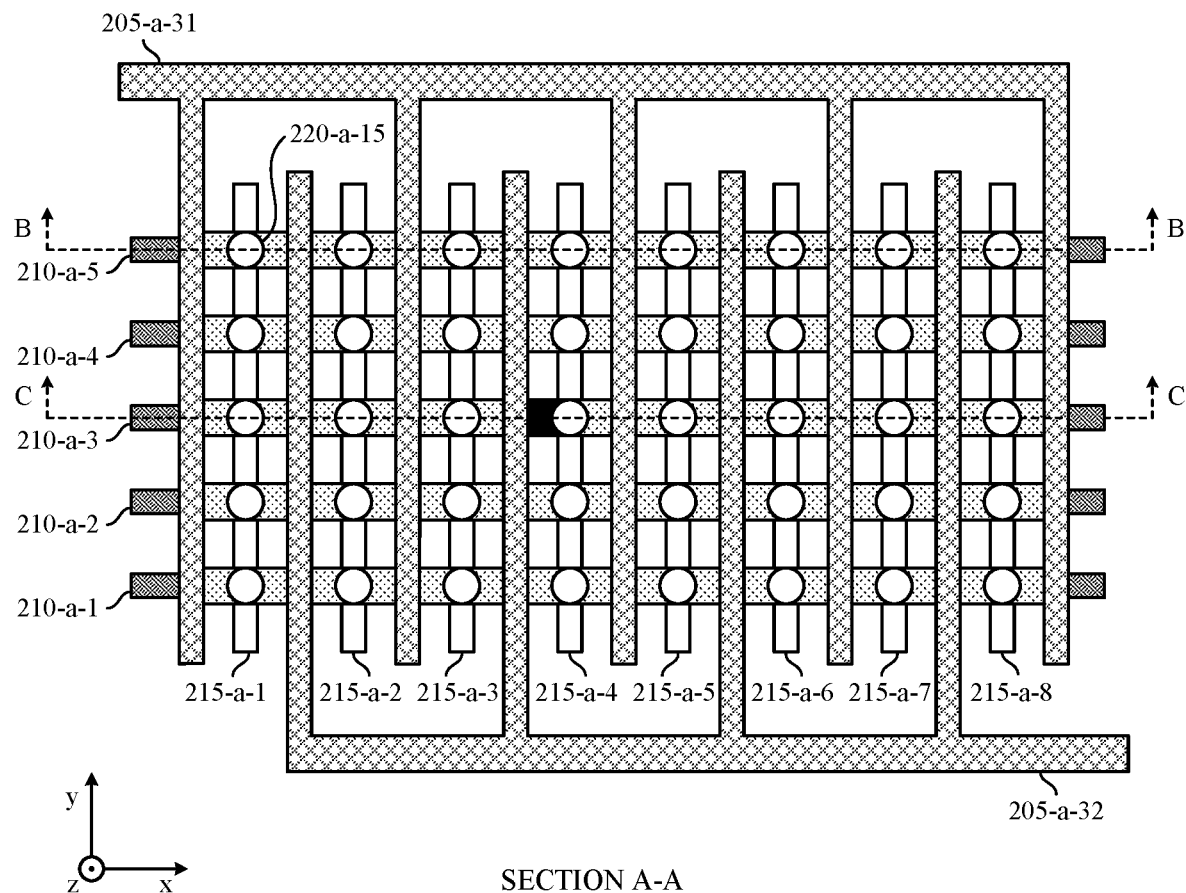
FIG. 2 illustrates a top view of an example of a memory array that supports transistor configurations for vertical memory arrays in accordance with examples as disclosed herein.
Figure 3A:
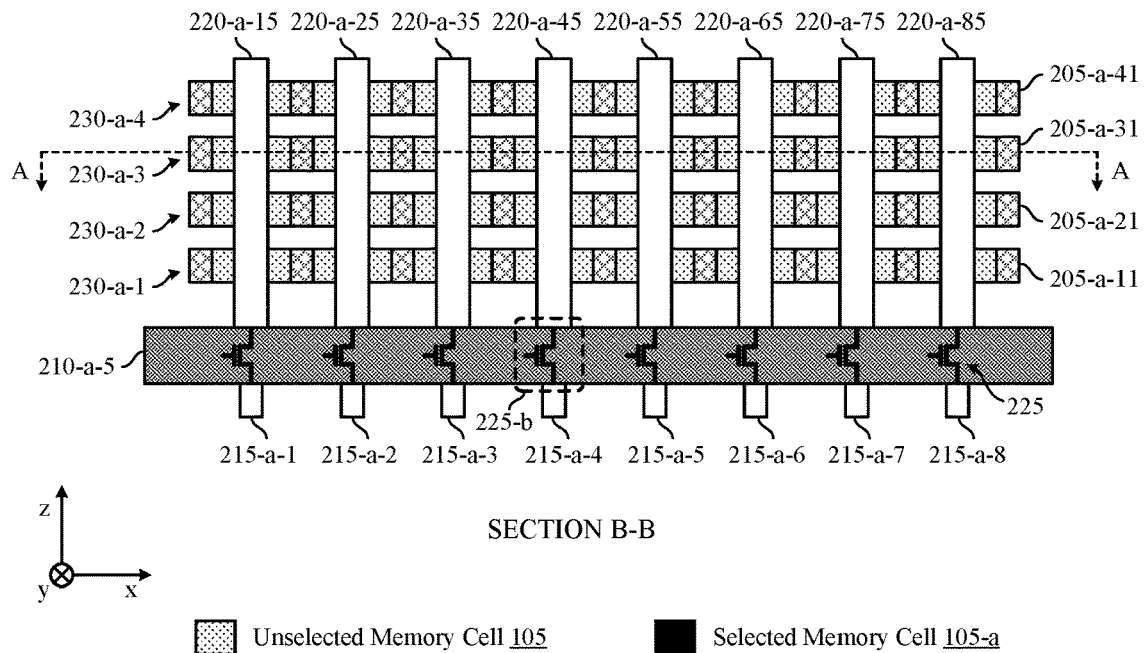
FIGS. 3A and 3B illustrate side views of an example of a memory array that supports transistor configurations for vertical memory arrays in accordance with examples as disclosed herein.
Figure 3B:
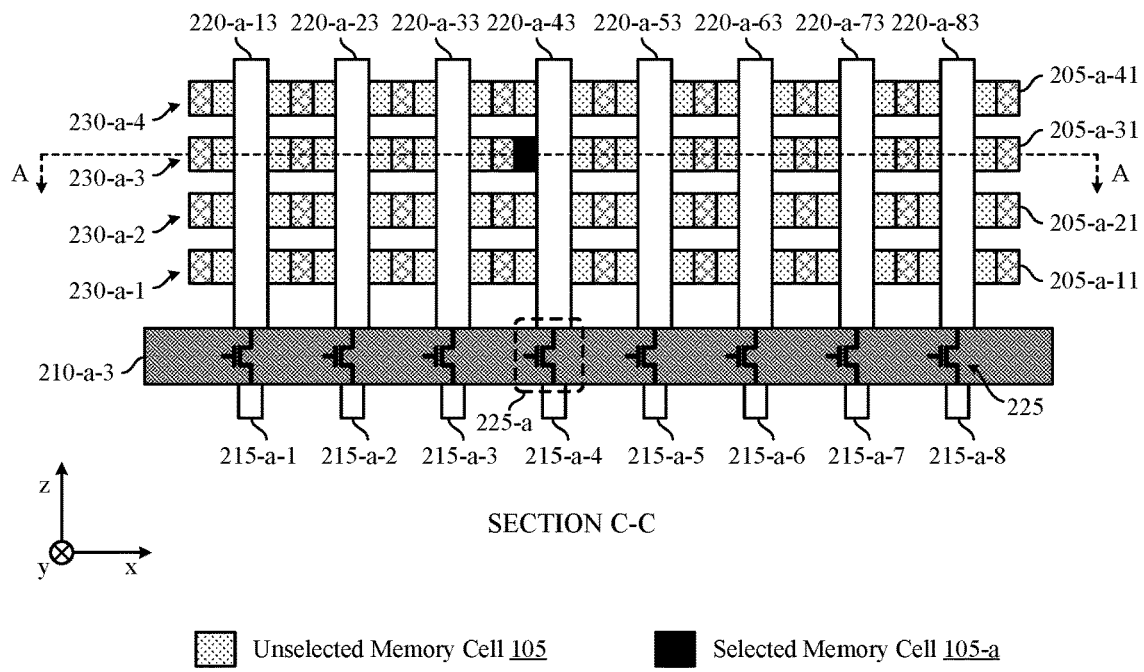

FIGS. 2, 3A, and 3B illustrate an example of a memory array 200 that supports transistor configurations for vertical memory arrays in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-a-n1 and even word lines 205-a-n2 for a given level, n), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-a, a corresponding access bias (e.g., the first voltage) may be applied to the word line 205-a-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a bit line 215 (e.g., a digit line, a column line, an access line extending along the y-direction) via a respective transistor 225 coupled between (e.g., physically, electrically) the pillar 220 and the bit line 215. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected bit line 215, or a combination thereof may be an example of a selected column line 125 described with reference to FIG. 1.

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a bit line 215). In some examples, the gate lines 210, the transistors 225, or both may be considered to be components of a row decoder 110 (e.g., as pillar decoder components). In some examples, the selection of (e.g., biasing of) pillars 220, or bit lines 215, or various combinations thereof, may be supported by a column decoder 120, or a sense component 130, or both.

To apply the corresponding access bias (e.g., $-V_{access}/2$) to the pillar 220-a-43, the bit line 215-a-4 may be biased with the access bias, and the gate line 210-a-3 may be grounded (e.g., biased to 0V) or otherwise biased with an activation voltage. In an example where a transistor 225 is an n-type transistor, the gate line 210-a-3 being biased with a voltage that is relatively higher than the bit line 215-a-4 may activate the transistor 225-a (e.g., cause the transistor 225-a to operate in a conducting state), thereby coupling the pillar 220-a-43 with the bit line 215-a-4 and biasing the pillar 220-a-43 with the associated access bias. In an example where a transistor 225 is a p-type transistor, the gate line 210-a-3 being biased with a voltage that is relatively lower than the bit line 215-a-4 may activate the transistor 225-a, thereby coupling the pillar 220-a-43 with the bit line 215-a-4 and biasing the pillar 220-a-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-a is activated, or may be coupled with another voltage source (e.g., grounded, via a high-resistance path, via a leakage path) to avoid a voltage drift of the pillars 220. For example, a ground voltage being applied to the gate line 210-a-3 may not activate other transistors 225 coupled with the gate line 210-a-3, because the ground voltage of the gate line 210-a-3 may not be greater than the voltage of the other bit lines 215 (e.g., which may be biased with a ground voltage or may be floating). Further, other unselected gate lines 210, including gate lines 210-a-5 as shown in FIG. 3A, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-b coupled with the gate line 210-a-5 may be deactivated (e.g., operating in a non-conductive state), thereby isolating the voltage of the bit line 215-a-4 from the pillar 220-a-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current), where such currents may be detected via an activated word line 205 or an activated bit line 215.

In some examples, deactivated transistors 225 along the bit line 215-a-4, among other transistors 225, may permit leakage during operations in which the bit line 215-a-4 is biased with an access bias. For example, unselected gate lines 210 (e.g., gate line 210-a-5) may be biased with a negative voltage having a magnitude equal to or similar to the bit line bias (e.g., a negative voltage having a magnitude of $V_{access}/2$) to deactivate the transistors 225 coupled with the bit line 215-a-4 and the unselected gate lines (e.g., the transistor 225-b). As such, respective gates of the deactivated transistors 225 may be biased to the negative voltage. Some access operations may cause a relatively large voltage differential across the deactivated transistors 225. For example, if the bit line 215-a-4 is biased with a positive access bias (e.g., where $-V_{access}/2$ is a positive voltage), a voltage differential across the deactivated transistors 225 may correspond to a difference between the negative voltage and the positive access bias (e.g., $V_{access}$). In some cases, a leakage associated with a transistor 225 may increase as a voltage differential across the transistor 225 increases. In some cases, increased leakage may be associated with increased power consumption, disrupted access operations (e.g., failed or slowed access operations due to leakage altering a current or charge along the bit line 215-a-4), or both.

In accordance with examples as disclosed herein, the memory array 200 may implement a multi-transistor architecture, such as a two-transistor architecture, in which pillars 220 may be coupled with two bit lines 215 using two transistors 225. For example, a pillar 220 may be coupled with a first bit line 215 via a first transistor 225 and coupled with a second bit line 215 via a second transistor 225. The first bit line 215 may be associated with biasing the pillar 220 with a positive voltage (e.g., for circumstances in which $-V_{access}/2$ is a positive voltage), and the second bit line 215 may be associated with biasing the pillar 220 with a negative voltage (e.g., for circumstances in which $-V_{access}/2$ is a negative voltage). For example, to bias the pillar 220 with the positive voltage, the memory array 200 may be configured to bias (e.g., using a bit line driver, a column decoder 120) the first bit line 215 with the positive voltage, activate the first transistor 225 to couple the pillar 220 with the first bit line 215, and deactivate the second transistor 225 to isolate the pillar 220 from the second bit line 215 (e.g., during which the second bit line may be floating, grounded, or biased with a negative voltage). To bias the pillar 220 with the negative voltage, the memory array 200 may be configured to bias (e.g., using a bit line driver, a column decoder 120) the second bit line 215 with the negative voltage, activate the second transistor 225 to couple the pillar 220 with the second bit line 215, and deactivate the first transistor 225 to isolate the pillar 220 from the first bit line 215 (e.g., during which the first bit line may be floating, grounded, or biased with a positive voltage).

By using different bit lines 215 to positively or negatively bias pillars 220, voltage differentials across deactivated transistors 225 may be reduced, thereby reducing leakage current with deactivated transistors 225. For example, the bit lines 215 and unselected gate lines 210 may be biased such that respective voltage differentials across deactivated transistors 225 is approximately half an access voltage (e.g., having a magnitude less than or equal to $V_{access}/2$) during an access operation. Thus, by implementing a multi-transistor architecture, such as a two-transistor architecture, to bias pillars 220 of the memory array 200 in accordance with examples as disclosed herein, the memory array 200 may be implemented with reduced leakage through deactivated transistors 225, which may support reduced power consumption, increased accuracy of access operations, or any combination thereof, among other benefits.

Figure 4:
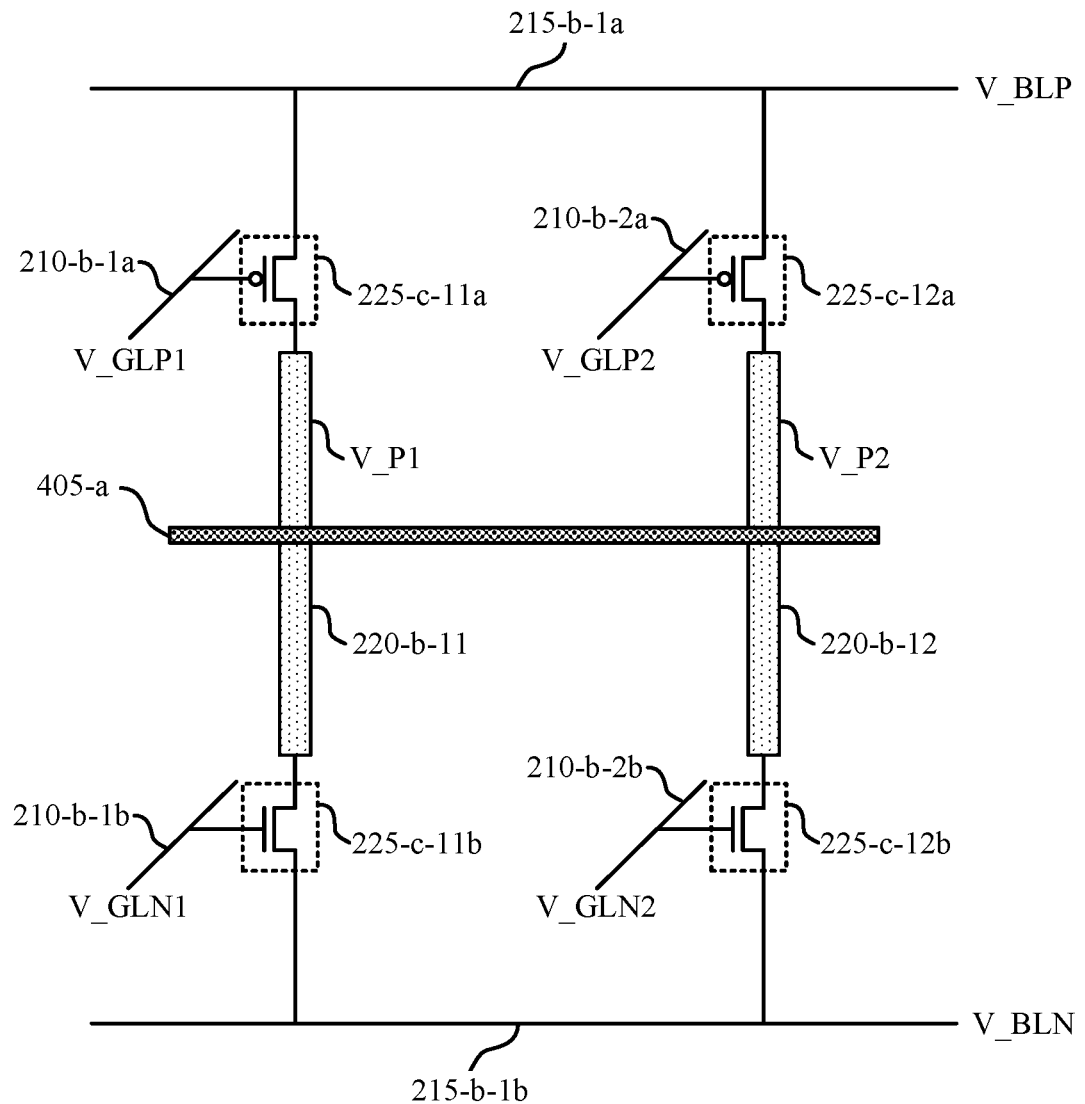
FIGS. 4, 5, and 6 illustrate examples of layouts that support transistor configurations for vertical memory arrays in accordance with examples as disclosed herein.

FIG. 4 illustrates an example of a layout 400 that supports transistor configurations for vertical memory arrays in accordance with examples as disclosed herein. The layout 400 may be an example for implementing aspects of a memory array 200 described with reference to FIGS. 2, 3A, and 3B, and aspects of the layout 400 may be described with reference to an x-direction (e.g., a row direction), a y-direction (e.g., a column direction), and a z-direction (e.g., a level direction). For example, the layout 400 may include an arrangement of pillars 220-b, which may be examples of pillars 220 described with reference to FIGS. 2, 3A, and 3B. The layout 400 may also include various arrangements of word lines 205 (e.g., arranged in a comb structure) and memory cells 105 (e.g., a three-dimensional array of memory cells 105), which also may be examples of the respective components described with reference to FIGS. 2, 3A, and 3B, though such components are omitted from FIG. 4 for the sake of illustrative clarity.

Each of the pillars 220-b may extend through one or more levels of memory cells 105 (e.g., levels 230) and may be coupled with one or more memory cells 105 (e.g., two memory cells 105) at each level 230. For example, at each level, one or more memory cells 105 may be coupled with (e.g., coupled physically between, coupled electrically between, or both) a pillar 220-b and a respective word line 205. Although the illustrative example of layout 400 includes circuitry associated with two pillars 220-b (e.g., a column of elements) along the x-direction, elements of the layout 400 in accordance with examples as disclosed herein may be repeated for any quantity of pillars 220-b along the x-direction and the y-direction (e.g., any quantity of rows and columns of elements in an xy-plane).

The layout 400 illustrates an example of a multi-transistor architecture, such as a two-transistor architecture, that may be implemented to facilitate biasing of pillars 220 (e.g., via bit lines 215-b extending along the x-direction). For example, the pillar 220-b-11 may be coupled with a bit line 215-b-1a via a transistor 225-c-11a and coupled with a bit line 215-b-1b via a transistor 225-c-11b, and the pillar 220-b-12 may be coupled with the bit line 215-b-1a via a transistor 225-c-12a and coupled with the bit line 215-b-1b via a transistor 225-c-12b. Such an arrangement may be associated with dividing the functionality of bit lines 215 and transistors 225 (e.g., as described with reference to FIGS. 2, 3A, and 3B) between pairs of such elements. For example, biasing of the pillars 220-b-11 and 220-b-12 with a first voltage polarity may be supported via the bit line 215-b-1a and biasing of the pillars 220-b-11 and 220-b-12 with a second voltage polarity (e.g., opposite from the first voltage polarity) may be supported via the bit line 215-b-1b.

To support some access operations, one of the bit line 215-b-1a the bit line 215-b-1b may be activated (e.g., coupled with a access voltage source, coupled with a sense component 130) while the other of the bit line 215-b-1a the bit line 215-b-1b may be deactivated (e.g., floating, coupled with an idle voltage source, isolated from a sense component 130). For example, the bit line 215-b-1a may be used for biasing one or both of the pillars 220-b-11 and 220-b-12 with positive access voltages (e.g., during which the pillars 220-b-11 and 220-b-12 may be isolated from the bit line 215-b-1b), and the bit line 215-b-1b may be used for biasing one or both of the pillars 220-b-11 and 220-b-12 with negative voltages (e.g., during which the pillars 220-b-11 and 220-b-12 may be isolated from the bit line 215-b-1a).

The transistors 225-c may be operable to couple the pillars 220-b with respective bit lines 215-b based in part on voltages at respective gates of the transistors 225-c. For example, the layout 400 may include gate lines 210-b, extending along the y-direction, that are coupled with gates of transistors 225-c (e.g., of a row of transistors 225-c along the y-direction) and operable to bias the gates of the transistors 225-c with various voltages. For instance, the layout 400 may include a gate line 210-b-1a that is coupled with a gate of the transistor 225-c-11a (e.g., and other transistors 225-c along the y-direction), a gate line 210-b-1b that is coupled with a gate of the transistor 225-c-11b, a gate line 210-b-2a that is coupled with a gate of the transistor 225-c-12a, and a gate line 210-b-2b that is coupled with a gate of the transistor 225-c-12b. Each of the gate lines 210-b may be independently driven (e.g., by a gate line driver) to bias the respective gates with respective voltages.

In the example of layout 400, each transistor 225-c may be coupled with (e.g., between, physically, electrically) a bit line 215-b and an end of a pillar 220-b. For example, the transistor 225-c-11a may be coupled between the bit line 215-b-1a and a first end of the pillar 220-b-11 (e.g., an end at a relatively positive position along the z-direction, a top end), the transistor 225-c-11b may be coupled between the bit line 215-b-1b and a second end of the pillar 220-b-11 (e.g., an end at a relatively negative position along the z-direction opposite the first end, a bottom end), and so on.

Here, the bit line 215-*b*-1*a* and the transistors 225-*c*-1*na* may be located above the pillars 220-*b* (e.g., relative to a substrate), and the bit line 215-*b*-1*b* and the transistors 225-*c*-1*nb* may be located below the pillars 220-*b* (e.g., between the pillars 220-*b* and the substrate). However, the layout 400 may be implemented such that the bit line 215-*b*-1*a* and the transistors 225-*c*-1*na* may be located below the pillars 220-*b*, and the bit line 215-*b*-1*b* and the transistors 225-*c*-1*nb* may be located above the pillars 220-*b*.

In some examples, the transistors 225-*c* or the bit lines 215-*b* located above the pillars 220-*b* may be formed based in part on a laser annealing process. For example, in some cases, a relatively high heat of other annealing processes associated with forming the transistors 225-*c* and the bit line 215 could damage memory cells 105 if exposed to the high heat. A laser annealing process may be associated with a reduced heat compared to the other annealing processes. Accordingly, by implementing a laser annealing process after the memory cells 105 are formed, a heat exposure of the memory cells 105 may be reduced, thereby reducing a potential for damaging the memory cells 105.

In some examples, a channel type of each transistor 225-*c* may be implemented based on whether the transistor 225-*c* is operable to couple a pillar 220-*b* with a positive voltage (e.g., a positively biased bit line 215-*b*, such as the bit line 215-*b*-1*a*) or a negative voltage (e.g., a negatively biased bit line 215-*b*, such as the bit line 215-*b*-1*b*). For example, the transistors 225-*c*-1*na* (e.g., associated with supporting a positive biasing of pillars 220-*b*) may be a first type of transistor (e.g., associated with a first channel type), and the transistors 225-*c*-1*nb* (e.g., associated with supporting a negative biasing of pillars 220-*b*) may be a second type of transistor (e.g., associated with a second channel type). In some examples, the transistors 225-*c*-1*na* may be p-type transistors and the transistors 225-*c*-1*nb* may be n-type transistors. For example, p-type transistors may be activated in response to biasing a gate line 210-*b* with a voltage that is relatively lower than a voltage of a bit line 215-*b*, and n-type transistors may be activated in response to biasing a gate line 210-*b* with a voltage that is relatively higher than a voltage of a bit line 215-*b*. Accordingly, biasing the bit line 215-*b*-1*a* with a positive voltage and biasing the gates of the transistors 225-*c*-1*na* with a ground voltage may activate the transistors 225-*c*-1*na* based on the transistors 225-*c*-1*na* being p-type transistors. Biasing the bit line 215-*b*-1*b* with a negative voltage and biasing the gates of the transistors 225-*c*-1*nb* with a ground voltage may activate the transistors 225-*c*-1*nb* based on the transistors 225-*c*-1*nb* being n-type transistors. Thus, in some examples, each pillar 220-*b* may be coupled with an n-type/p-type transistor pair to support negative and positive biasing of the pillar 220-*b* by respective bit lines 215-*b*.

The layout 400 may support accessing a memory cell 105 (e.g., reading a logic state of the memory cell 105, writing a logic state to the memory cell 105, among other access operations) based on biasing a pillar 220-*b* coupled with the memory cell 105 using the bit line 215-*b*-1*a* or the bit line 215-*b*-1*b*. For example, when performing an access of a memory cell 105 coupled with the pillar 220-*b*-12, a memory device 100 that includes the layout 400 may be configured to bias the pillar 220-*b*-12 using one of the bit line 215-*b*-1*a* or the bit line 215-*b*-1*b* and isolate the pillar 220-*b*-11 from the other of the bit line 215-*b*-1*a* or the bit line 215-*b*-1*b*. Based on which bit line 215-*b* is used to bias the pillar 220-*b*-12 (e.g., based on whether the pillar 220-*b*-12 is biased to a positive voltage or a negative voltage), the memory device 100 may be configured to isolate the unselected bit line 215-*b* from the pillar 220-*b*-12.

Table 1 below depicts example voltages associated with an "Idle" condition (e.g., associated with an idle state of the memory device 100, associated with pillars 220-*b*-11 and 220-*b*-12 being unselected for a given access operation), a "Positive" condition (e.g., associated with performing an access operation on a memory cell 105 coupled with the pillar 220-*b*-12 having a positive cell bias via bit line 215-*b*-1*a*), and a "Negative" condition" (e.g., associated with performing an access operation on a memory cell coupled with the pillar 220-*b*-12 having a negative cell bias via bit line 215-*b*-1*b*). As illustrated in the layout 400, a voltage V_GLP1 may correspond to a voltage of the gate line 210-*b*-1*a*, a voltage V_GLN1 may correspond to a voltage of the gate line 210-*b*-1*b*, a voltage V_GLP2 may correspond to a voltage of the gate line 210-*b*-2*a*, a voltage V_GLN2 may correspond to a voltage of the gate line 210-*b*-2*b*, a voltage V_BLP may correspond to a voltage of the bit line 215-*b*-1*a*, a voltage V_BLN may correspond to a voltage of the bit line 215-*b*-1*b*, a voltage V_P1 may correspond to a voltage of the pillar 220-*b*-11, a voltage V_P2 may correspond to a voltage of the pillar 220-*b*-12, and a voltage V_WL may correspond to a voltage of a word line 205 (e.g., a selected or otherwise representative word line 205). The voltages included in Table 1 are example values are for illustrative purposes, and other voltage values may be used to support the access operations as described herein.

TABLE 1

Access voltages associated with operating the layout 400

| | Access Voltages (V) | | |
|---|---|---|---|
| | Idle | Positive | Negative |
| V_GLP1 | 3.5 V | 3.5 V | 3.5 V |
| V_GLN1 | −3.5 V | −3.5 V | −3.5 V |
| V_GLP2 | 3.5 V | 0 V | 0 V |
| V_GLN2 | −3.5 V | 0 V | 0 V |
| V_BLP | 0 V | 3.5 V | 0 V |
| V_BLN | 0 V | 0 V | −3.5 V |
| V_P1 | ~0 V | ~0 V | 0 V |
| V_P2 | ~0 V | 3.5 V | −3.5 V |
| V_WL | 0 V | −3.5 V | 3.5 V |

In the "Idle" condition, the bit lines 215-*b* and the gate lines 210-*b* may be biased such that each of the transistors 225-*c* are deactivated. For example, a voltage of the gate lines 210-*b*-*na* may be greater than a voltage of the bit lines 215-*b*-1*a*, and a voltage of the gate lines 210-*b*-*nb* may be less than a voltage of the bit lines 215-*b*-1*b*. As a result, each of the transistors 225-*c* may be deactivated such that the pillar 220-*b*-11 and the pillar 220-*b*-12 are isolated from the bit lines 215-*b* (e.g., and may be referred to as unselected pillars 220-*b*).

In some examples, a voltage of the pillars 220-*b* may be biased to approximately 0V during an isolation from the bit lines 215-*b*. For example, each of the pillars 220-*b* may be coupled with a voltage source via a coupling 405-*a* (e.g., a resistive coupling, a leaker tier, a leaker layer). A coupling 405 may include a material that provides a charge dissipation, such as a coupling having a relatively high resistance or impedance with a ground node or other voltage source (e.g., to support a passive equalization, to reduce or prevent a floating condition). For example, a coupling 405 may have a resistance that is greater than a resistance associated with each of the memory cells 105, which may provide charge dissipation with relatively low power consumption (e.g., compared to a relatively low resistance dissipative coupling). In some examples, a coupling 405 may be excluded from the layout 400, such that the pillars 220-*b* may be in an electrically floating condition while isolated from the bit lines 215-*b*.

In some examples, the coupling 405-*a* may be located between two levels of memory cells 105 of the layout 400. For example, a level 230 of an array that may otherwise include memory cells 105 may be replaced with the coupling 405-*a* so that the pillars 220-*b* may be weakly coupled with the voltage source (e.g., weakly coupled with ground). Here, the pillars 220-*b* may extend through the coupling 405-*a* and may be coupled with the coupling 405-*a* at a level of the coupling 405-*a* within a memory array. In various examples, a coupling 405 may be implemented in place of a bottom level of memory cells 105, in place of a top level of the memory cells 105, or may be implemented on multiple levels, among other examples.

In the "Positive" condition (e.g., when accessing a memory cell 105 with a positive cell bias via the pillar 220-*b*-12), the bit lines 215-*b* and the gate lines 210-*b* may be biased such that the pillar 220-*b*-12 is coupled with the bit line 215-*b*-1*a* and isolated from the bit line 215-*b*-1*b*. For example, when accessing the memory cell 105 via the pillar 220-*b*-12, a bit line driver (e.g., a column decoder 120) may bias the bit line 215-*b*-1*a* with a first access voltage (e.g., 3.5V) and bias the bit line 215-*b*-1*b* with a ground voltage (e.g., 0V). Additionally, the gate line 210-*b*-2*a* may be biased with a first voltage such that the transistor 225-*c*-12*a* is activated, and the gate line 210-*b*-2*b* may be biased with a second voltage such that the transistor 225-c-12*b* is deactivated. In some examples, each of the gate line 210-*b*-2*a* and the gate line 210-*b*-2*b* may be biased with a same voltage, such as a ground voltage (e.g., 0V), and the transistor 225-*c*-12*a* and the transistor 225-*c*-12*b* may be activated or deactivated based on the biasing of the respective bit lines 215-*b*. For example, V_BLP may be greater than V_GLP2 (e.g., 3.5V>0V) which may cause the transistor 225-*c*-12*a* to be activated and couple the pillar 220-*b*-12 with the bit line 215-*b*-1*a* and V_BLN may equal V_GLN2 (e.g., both biased to 0V) which may cause the transistor 225-*c*-12*b* to be deactivated and isolate the pillar 220-*b*-12 from the bit line 215-*b*-1*b*.

Based on coupling the pillar 220-*b*-12 with the bit line 215-*b*-1*a*, the pillar 220-*b*-12 may be biased with the first access voltage (e.g., 3.5V), which may correspond to the voltage −V$_{access}$/2 described with reference to FIGS. 2, 3A, and 3B. For example, coupling the pillar 220-*b*-12 with the bit line 215-*b*-1*a* may cause the first access voltage to be applied to the pillar 220-*b*-12 such that V_P2 equals V_BLP. For the "Positive" condition, an access bias (e.g., V$_{access}$) may be applied across the memory cell 105 in conjunction with a biasing of a word line 205 that is coupled with the memory cell 105. For example, a word line driver may bias the word line 205 with a second access voltage (e.g., V_WL=−3.5V), which may correspond to the voltage V$_{access}$/2 described with reference to FIGS. 2, 3A, and 3B. A logic state may be read from the memory cell 105 or written to the memory cell 105 based on the access bias. For example, the logic state may be read based on whether the memory cell 105 thresholds in response to the access bias. In some examples, applying the access bias associated with the "Positive" condition may set the selected memory cell 105 with a first characteristic (e.g., a first threshold voltage) associated with storing a first logic state (e.g., a logic 0).

In the "Negative" condition (e.g., when accessing a memory cell 105 with a negative cell bias via the pillar 220-*b*-12), the bit lines 215-*b* and the gate lines 210-*b* may be biased such that the pillar 220-*b*-12 is coupled with the bit line 215-*b*-1*b* and isolated from the bit line 215-*b*-1*a*. For example, when accessing the memory cell 105 via the pillar 220-*b*-12, a bit line driver may bias the bit line 215-*b*-1*b* with a third access voltage (e.g., −3.5V) and bias the bit line 215-*b*-1*b* with a ground voltage (e.g., 0V). Additionally, the gate line 210-*b*-2*b* may be biased with the first voltage such that the transistor 225-*c*-12*b* is activated, and the gate line 210-*b*-2*a* may be biased with the second voltage such that the transistor 225-*c*-12*a* is deactivated. In some examples, each of the gate line 210-*b*-2*a* and the gate line 210-*b*-2*b* may be biased with a same voltage, such as a ground voltage (e.g., 0V), and the transistor 225-*c*-12*a* and the transistor 225-*c*-12*b* may be activated or deactivated based on the biasing of the respective bit lines 215-*b*. For example, V_BLP may equal V_GLP2 (e.g., both biased to 0V) which may cause the transistor 225-*c*-12*a* to be deactivated and isolate the pillar 220-*b*-12 from the bit line 215-*b*-1*a*. V_BLN may be less than V_GLN2 (e.g., −3.5V<0V) which may cause the transistor 225-*c*-12*b* to be activated and couple the pillar 220-*b*-12 with the bit line 215-*b*-1*b*.

Based on coupling the pillar 220-*b*-12 with the bit line 215-*b*-1*b*, the pillar 220-*b*-12 may be biased with the third access voltage (e.g., −3.5V) such that V_P2 equals V_BLN. For the "Negative" condition, an access bias may be applied across the memory cell 105 in conjunction with a biasing of the word line 205 that is coupled with the memory cell 105. For example, a word line driver may bias the word line 205 with a fourth access voltage (e.g., V_WL=3.5V). In some examples, a logic state may be read from the memory cell 105 based on whether the memory cell 105 thresholds in response to the access bias. In some examples, applying the access bias associated with the "Negative" condition may set the selected memory cell 105 with a second characteristic (e.g., a second threshold voltage) associated with storing a second logic state (e.g., a logic 1).

When accessing the memory cell 105 via the pillar 220-*b*-12 (e.g., with a positive or negative cell bias), the bit lines 215-*b* and the gate lines 210-*b* may be biased such that the pillar 220-*b*-11 is isolated from both the bit line 215-*b*-1*a* and the bit line 215-*b*-1*b*. For example, when accessing the memory cell 105 via the pillar 220-*b*-12, both of the gate lines 210-*b* associated with the pillar 220-*b*-11 (e.g., the gate line 210-*b*-1*a* and the gate line 210-*b*-1*b*) may be biased in accordance with the "Idle" condition (e.g., V_GLP1=3.5V and V_GLN1=−3.5V). As a result, both the transistor 225-*c*-11*a* and the transistor 225-*c*-11*b* may be deactivated regardless of whether the bit line 215-*b*-1*a* is biased with the first access voltage or the bit line 215-*b*-1*b* is biased with the third access voltage. For example, during the positive cell biasing, V_GLP1=V_BLP and V_GLN1<V_BLN, and during negative cell biasing, V_GLP1>V_BLP and V_GLN1=V_BLN. Accordingly, neither the transistor 225-*c*-11*a* nor the transistor 225-*c*-11*b* may be activated during the "Positive" condition or during the "Negative" condition. Thus, the pillar 220-*b*-11 may be isolated from the bit lines 215-*b* during an access operation via the pillar 220-*b*-12.

In some examples, the pillar 220-*b*-11 may be biased to ~0V when isolated from the bit lines 215-*b* based on being coupled with the coupling 405-*a*, which may, for example, reduce (e.g., dissipate) a voltage of the pillar 220-*b*-11 to ground. In some examples, the pillar 220-*b*-11 may be electrically floating based on being isolated from the bit lines 215-*b* (e.g., if a coupling 405 is excluded from the layout 400).

In some examples, the biasing of the gate lines 210-*b* and the bit lines 215-*b* may return to that of the idle state after an access operation. The coupling 405-*a* may reduce a voltage difference between the pillar 220-*b* and the voltage source (e.g., the ground node), or otherwise dissipate or prevent charge accumulation on the pillars 220-*b*. For example, after the access operation, the pillar 220-*b*-12 may be isolated from the bit lines 215-*b*, and the pillar 220-*b*-12 may still be at least partially biased to an access voltage (e.g., the first access voltage, the third access voltage). To dissipate such a bias, the coupling 405-*a* may support a flow of charge to or from the pillar 220-*b*-12 based on a voltage difference between the pillar 220-*b*-12 and voltage source (e.g., a ground voltage source). In some examples, the coupling 405-*a* may allow at least some charge to flow to or from the pillar 220-*b*-12 during the access operation. However, such a flow of charge may be slow enough such that the coupling with the bit line 215-*b*-1*a* or the bit line 215-*b*-1*b* may maintain the bias of the pillar 220-*b*-12 at an access voltage during the access operation.

By implementing a multi-transistor architecture, such as a two-transistor architecture, for biasing pillars 220-*b*, the layout 400 illustrates an example for reducing leakage through unselected transistors 225-*c*. For example, leakage through a deactivated transistor 225-*c* may be related to (e.g., proportional to) a magnitude of a voltage differential across the deactivated transistor 225-*c*. In the described examples for a multi-transistor architecture, such as a two-transistor architecture, a highest voltage differential across a deactivated transistor 225-*c* while biasing the pillars 220-*b* may be a magnitude of an access voltage of the bit lines 215-*b*, which may correspond to a magnitude of $V_{access}/2$ described with reference to FIGS. 2, 3A, and 3B (e.g., compared with a magnitude of $V_{access}$ in some single-transistor architectures). Thus, by implementing a multi-transistor architecture, such as a two-transistor architecture, in accordance with the layout 400, a voltage differential across a deactivated transistor 225-*c* may be less than in configurations that implement a single transistor architecture to bias pillars 220, which may reduce a corresponding leakage.

In various examples, reducing leakage may support reduced power consumption, improved access operation accuracy, or a combination thereof, among other benefits. For example, such leakage may be associated with a power consumption (e.g., of a voltage source) for maintaining desired access voltages despite the flow of non-useful charge. In some examples, such leakage may cause errors in read operations. For example, a leakage current may be superimposed on a read current through a memory cell 105, which may result in an improper evaluation of a resistance state stored by a memory cell 105, or an improper evaluation of whether a memory cell 105 has thresholded, among other inaccuracies. Thus, by reducing leakage (e.g., associated with deactivated transistors), a multi-transistor architecture, such as a two-transistor architecture, for biasing pillars 220-*b* may improve the performance of a memory device 100 that implements one or more aspects of the layout 400.

Figure 5:
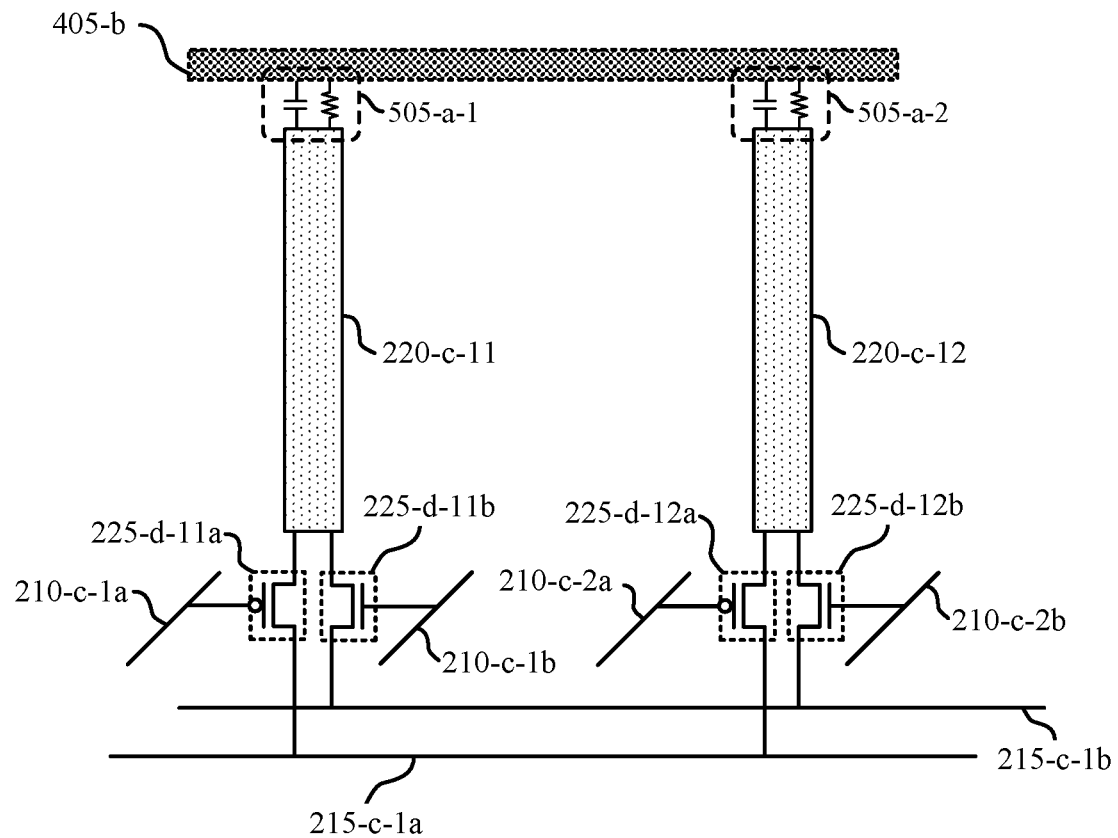

FIG. 5 illustrates an example of a layout 500 that supports transistor configurations for vertical memory arrays in accordance with examples as disclosed herein. The layout 500 may be another example for implementing aspects of a memory array 200 described with reference to FIGS. 2, 3A, and 3B, and aspects of the layout 500 may be described with reference to an x-direction (e.g., a row direction), a y-direction (e.g., a column direction), and a z-direction (e.g., a level direction). For example, the layout 400 may include an arrangement of pillars 220-*c*, which may be examples of pillars 220 described with reference to FIGS. 2, 3A, and 3B. The layout 500 may also include various arrangements of word lines 205 and memory cells 105, which also may be examples of the respective components described with reference to FIGS. 2, 3A, and 3B, though such components are omitted from FIG. 4 for the sake of illustrative clarity.

The layout 500 illustrates another example of a multi-transistor architecture, such as a two-transistor architecture, that may be implemented to facilitate biasing of the pillars 220, which may be similar (e.g., electrically, operationally) to the layout 400, but may implement a different physical arrangement of elements. For example, the pillar 220-*c*-11 may be coupled with a bit line 215-*c*-1*a* via a transistor 225-*d*-11*a* (e.g., based on a voltage of a gate line 210-*c*-1*a*) and coupled with a bit line 215-*c*-1*b* via a transistor 225-*d*-11*b* (e.g., based on a voltage of a gate line 210-*c*-1*b*), and the pillar 220-*d*-12 may be coupled with the bit line 215-*c*-1*a* via a transistor 225-*d*-12*a* (e.g., based on a voltage of a gate line 210-*c*-2*a*) and coupled with the bit line 215-*c*-1*b* via a transistor 225-*d*-12*b* (e.g., based on a voltage of a gate line 210-*c*-2*b*). In some examples, such elements may be operated similarly to the respective elements described with reference to the layout 400 (e.g., where the bit line 215-*c*-1*a* may support biasing the pillars 220-*c* with positive voltages and the bit line 215-*c*-1*b* may support biasing the pillars 220-*c* with negative voltages).

In the example of the layout 500, each transistor 225-*d* may be coupled with a bit line 215-*c* and an end of a pillar 220-*c* that is between the memory cells 105 (e.g., levels 230) and a substrate. For example, features of the layout 500 may be formed on or above a substrate, and each transistor 225-*d* may be formed between a bit line 215-*c* and an end (e.g., a bottom) of a pillar 220-*c* along the z-direction (e.g., an end of the pillar 220-*c* at a relatively negative position along the z-direction). In some examples, each of the gate lines 210-*c*, bit lines 215-*c*, and transistors 225-*d* may be located below the pillars 220-*c* in the z-direction (e.g., below the end of the pillars 220-*c* between the memory cells 105 and the substrate).

The layout 500 may also include a coupling 405-*b*, which may be an example of a coupling 405 described with reference to FIG. 4. The coupling 405-*b* may be material that provides a dissipative coupling with a ground node or other voltage source. As illustrated, the coupling 405-*b* may be associated with a respective coupling portion 505 for each of the pillars 220-*c*, which may be a resistive impedance, a capacitive impedance, or a combination thereof (e.g., an RC impedance). In the example of layout 500, the coupling 405-*b* may be located over the pillars 220-*c* (e.g., above an end of the pillars 220-*c* that is opposite from the substrate). In some other examples (not shown), the layout 500 may implement a coupling 405 at or between levels 230 (e.g., as described with reference to FIG. 4).

In some examples of the layout 500, relative positions of the illustrated elements along the z-direction may be reversed, such that gate lines 210-*c*, bit lines 215-*c*, and transistors 225-*d* may be located above the pillars 220-*c* (e.g., opposite from a substrate). In some examples, the gate lines 210-*c*, the bit lines 215-*c*, and the transistors 225-*d* may be formed on or above the pillars 220-*c* based in part on a laser annealing process (e.g., when such features are formed after the memory cells 105 are formed).

Figure 6:
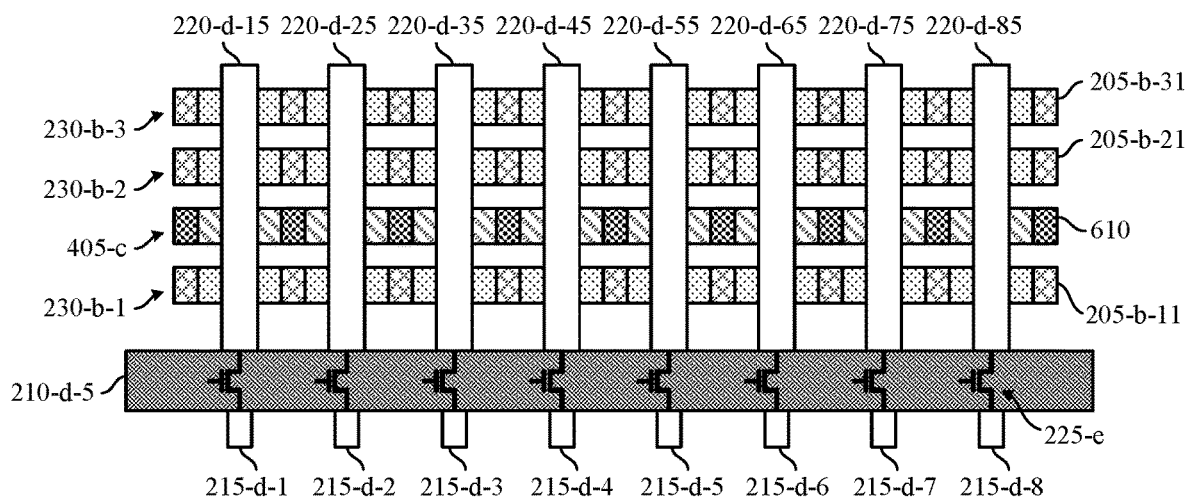

FIG. 6 illustrates an example of a layout 600 that supports transistor configurations for vertical memory arrays in accordance with examples as disclosed herein. The layout 600 may be an example for implementing aspects of a memory array 200 described with reference to FIGS. 2, 3A, and 3B. For example, the layout 600 may illustrate a side section view (e.g., SECTION B-B) of a memory array 200 relative to a cut plane B-B (e.g., as shown in FIG. 2). The layout 600 may include an arrangement of memory cells 105, word lines 205-b, gate lines 210-d, bit lines 215-d, pillars 220-d, and transistors 225-e, which may be examples of the respective components described with reference to FIGS. 2, 3A, and 3B. Aspects of the layout 600 may be described with reference to an x-direction, a y-direction, and a z-direction.

The layout 600 illustrates an example for implementing a coupling 405-c, which may include a leaker material 605 and a conductor portion 610. The coupling 405-c may extend along the x-direction and the y-direction such that the coupling 405-c is coupled with each of the pillars 220-d included in a memory device 100 that includes the layout 600. The coupling 405-c may provide a dissipative coupling with a ground node or other voltage source (e.g., to prevent or mitigate a floating condition of the pillars 220-d).

The coupling 405-c may be located (e.g., formed) between levels 230-b of the layout 600 (e.g., between levels 230-b-1 and 230-b-2). In some examples, implementing the coupling 405-c may involve replacing a level that would otherwise include memory cells 105. For example, elements of the coupling 405-c may be implemented in place of memory cells 105 and word lines 205 that would otherwise be formed at a level of the coupling 405-c along the z-direction. In some examples of the layout 600 (not shown), a coupling 405-c may replace a bottom level 230-b (e.g., may be located below the levels 230-b) or a top level 230-b (e.g., may be located above the levels 230-b).

The coupling 405-c may include various materials to support the dissipative coupling. For example, the coupling 405-c may include a leaker material 605 that provides a coupling between pillars 220-d and conductor portion 610, where the leaker material 605 may support aspects of a coupling portion 505 described with reference to FIG. 5. For example, the leaker material 605 may be formed in portions (e.g., discrete portions) that are each associated with a respective impedance (e.g., a relatively high resistance) between a pillar 220-d and the conductor portion 610, where the conductor portion 610 may be a conductive material that is coupled with a ground node or other voltage source. In some examples, formation of the leaker material 605 and the conductor portion 610 may implement aspects of formation that are similar to memory cells 105 and word lines 205, respectively, such as implementing similar patterning, among other operations. In some examples, formation of the conductor portion 610 may implement the same or similar conductor formation operations used to form the word lines 205-b (e.g., may be the same or similar material and shape as word lines 205-b), and formation of the leaker material 605 may implement similar operations used to form the memory cells 105, but with a different (e.g., higher resistance) material.

Figure 7:
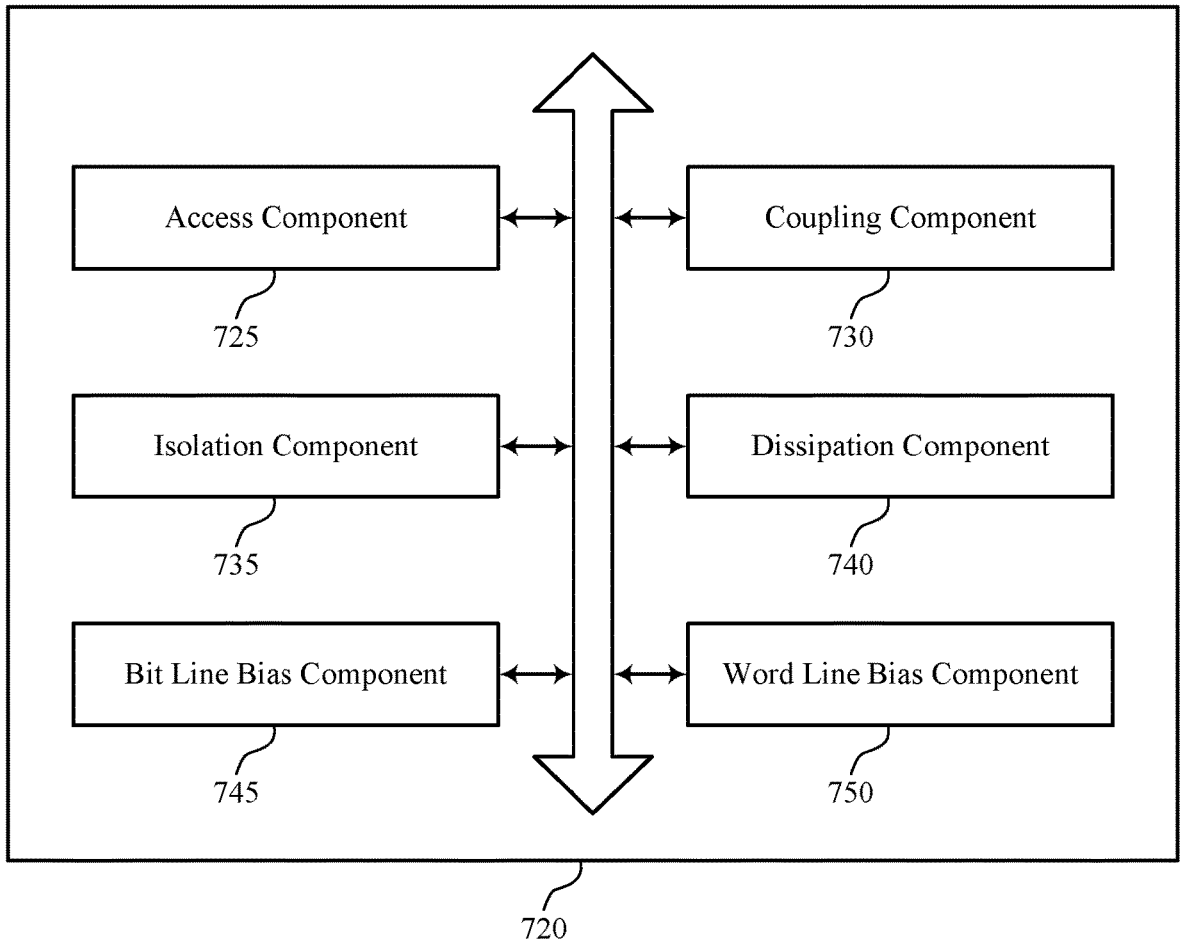
FIG. 7 shows a block diagram of a memory system that supports transistor configurations for vertical memory arrays in accordance with examples as disclosed herein.

FIG. 7 shows a block diagram 700 of a memory system 720 that supports transistor configurations for vertical memory arrays in accordance with examples as disclosed herein. The memory system 720 may be an example of aspects of a memory system as described with reference to FIGS. 1 through 6. The memory system 720, or various components thereof, may be an example of means for performing various aspects of transistor configurations for vertical memory arrays as described herein. For example, the memory system 720 may include an access component 725, a coupling component 730, an isolation component 735, a dissipation component 740, a bit line bias component 745, a word line bias component 750, or any combination thereof. Each of these components may communicate, directly or indirectly, with one another (e.g., via one or more buses).

The access component 725 may be configured as or otherwise support a means for accessing a memory cell that is coupled between a conductive pillar of a memory die and a word line of the memory die. In some examples, the memory cell may include a chalcogenide storage element.

In some examples, to support the accessing by the access component 725, the coupling component 730 may be configured as or otherwise support a means for coupling the conductive pillar with a first bit line based at least in part on activating a first transistor between the conductive pillar and the first bit line. In some examples, to support the accessing by the access component 725, the isolation component 735 may be configured as or otherwise support a means for isolating the conductive pillar from a second bit line based at least in part on deactivating a second transistor between the conductive pillar and the second bit line. In some examples, to support the accessing by the access component 725, the word line bias component 750 may be configured as or otherwise support a means for biasing the word line with a first access voltage. In some examples, to support the accessing by the access component 725, the bit line bias component 745 may be configured as or otherwise support a means for biasing the first bit line with a second access voltage.

In some examples, activating the first transistor is based at least in part on biasing a gate of the first transistor with a first voltage. In some examples, deactivating the second transistor is based at least in part on biasing a gate of the second transistor with a second voltage. In some examples, the first voltage and the second voltage are a same voltage.

In some examples, the first transistor is associated with a first channel type. In some examples, the second transistor is associated with a second channel type that is different than the first channel type.

In some examples, activating the first transistor is based at least in part on biasing the first bit line with the second access voltage being greater than the same voltage. In some examples, deactivating the second transistor is based at least in part on biasing the second bit line with the same voltage.

In some examples, activating the first transistor is based at least in part on biasing the first bit line with the second access voltage being less than the same voltage. In some examples, deactivating the second transistor is based at least in part on biasing the second bit line with the same voltage.

In some examples, the dissipation component 740 may be configured as or otherwise support a means for reducing, after the accessing, a voltage difference between the conductive pillar and a ground node via a resistive coupling between the conductive pillar and the ground node having a first resistance that is greater than a second resistance associated with the memory cell.

In some examples, the isolation component 735 may be configured as or otherwise support a means for isolating, during the accessing, a second conductive pillar from the first bit line based at least in part on deactivating a third transistor between the second conductive pillar and the first bit line. In some examples, the isolation component 735 may be configured as or otherwise support a means for isolating, during the accessing, the second conductive pillar from the second bit line based at least in part on deactivating a fourth transistor between the second conductive pillar and the second bit line.

Figure 8:
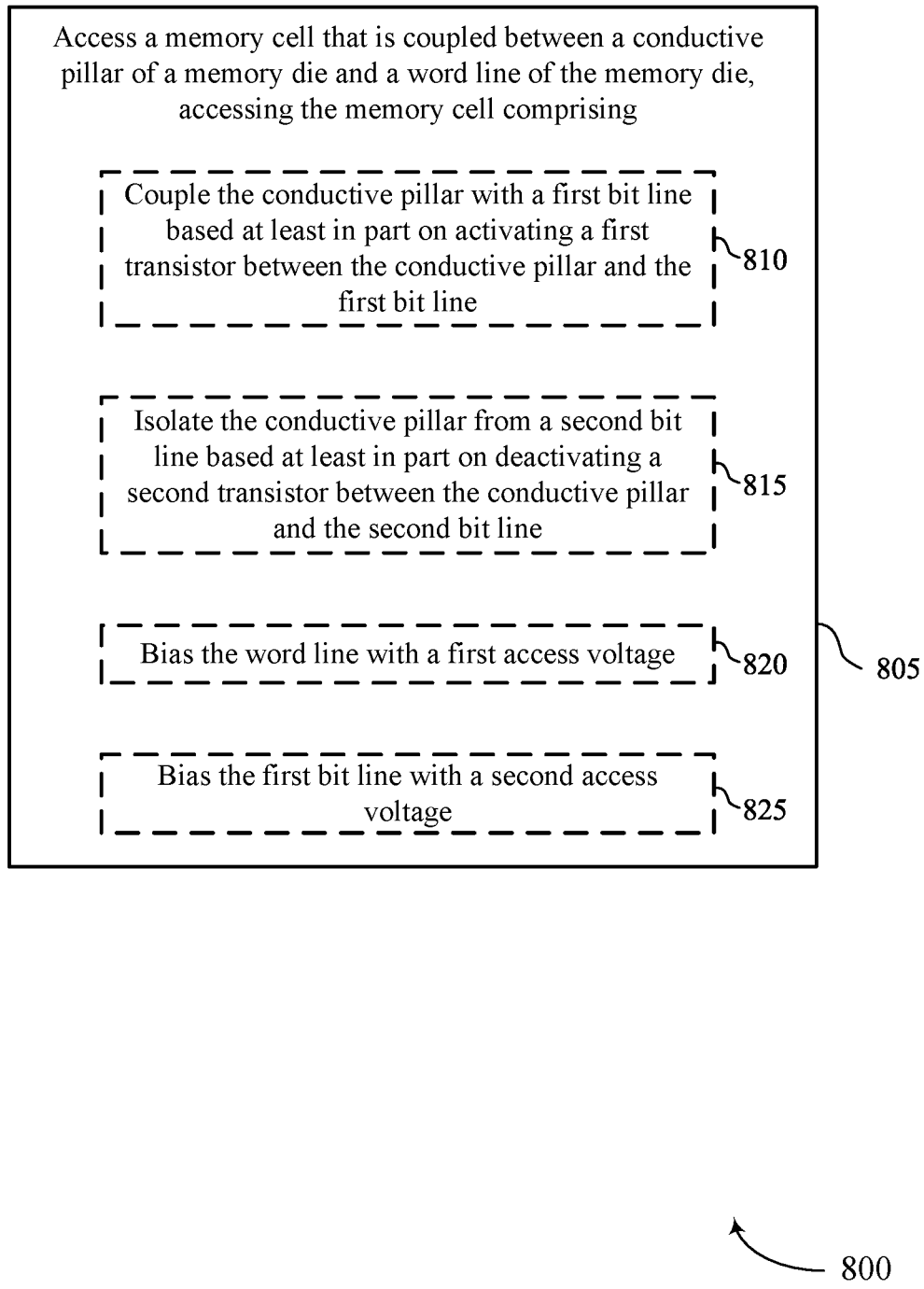
FIG. 8 shows a flowchart illustrating a method or methods that support transistor configurations for vertical memory arrays in accordance with examples as disclosed herein.

FIG. 8 shows a flowchart illustrating a method 800 that supports transistor configurations for vertical memory arrays in accordance with examples as disclosed herein. The operations of method 800 may be implemented by a memory system or its components as described herein. For example, the operations of method 800 may be performed by a memory system as described with reference to FIGS. 1 through 7. In some examples, a memory system may execute a set of instructions to control the functional elements of the device to perform the described functions. Additionally, or alternatively, the memory system may perform aspects of the described functions using special-purpose hardware.

At 805, the method may include accessing a memory cell that is coupled between a conductive pillar of a memory die and a word line of the memory die. The operations of 805 may be performed in accordance with examples as disclosed herein. In some examples, aspects of the operations of 805 may be performed by an access component 725 as described with reference to FIG. 7. The accessing of 805 may be performed in accordance with various techniques as disclosed herein, which may include the operations of 810, 815, 820, or 825, or any combination thereof, among other operations.

In some examples, the accessing of 805 may include (e.g., at 810) coupling the conductive pillar with a first bit line based at least in part on activating a first transistor between the conductive pillar and the first bit line. The operations of 810 may be performed in accordance with examples as disclosed herein. In some examples, aspects of the operations of 810 may be performed by a coupling component 730 as described with reference to FIG. 7.

In some examples, the accessing of 805 may include (e.g., at 815) isolating the conductive pillar from a second bit line based at least in part on deactivating a second transistor between the conductive pillar and the second bit line. The operations of 815 may be performed in accordance with examples as disclosed herein. In some examples, aspects of the operations of 815 may be performed by an isolation component 735 as described with reference to FIG. 7.

In some examples, the accessing of 805 may include (e.g., at 820) biasing the word line with a first access voltage. The operations of 820 may be performed in accordance with examples as disclosed herein. In some examples, aspects of the operations of 820 may be performed by a bit line bias component 745 as described with reference to FIG. 7.

In some examples, the accessing of 805 may include (e.g., at 825) biasing the first bit line with a second access voltage. The operations of 825 may be performed in accordance with examples as disclosed herein. In some examples, aspects of the operations of 820 may be performed by a bit line bias component 745 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for accessing a memory cell that is coupled between a conductive pillar of a memory die and a word line of the memory die, accessing the memory cell including: coupling the conductive pillar with a first bit line based at least in part on activating a first transistor between the conductive pillar and the first bit line, isolating the conductive pillar from a second bit line based at least in part on deactivating a second transistor between the conductive pillar and the second bit line, biasing the word line with a first access voltage, and biasing the first bit line with a second access voltage.

Aspect 2: The method, apparatus, or non-transitory computer-readable medium of aspect 1 where activating the first transistor is based at least in part on biasing a gate of the first transistor with a first voltage and deactivating the second transistor is based at least in part on biasing a gate of the second transistor with a second voltage.

Aspect 3: The method, apparatus, or non-transitory computer-readable medium of aspect 2 where the first voltage and the second voltage are a same voltage.

Aspect 4: The method, apparatus, or non-transitory computer-readable medium of aspect 3 where the first transistor is associated with a first channel type and the second transistor is associated with a second channel type that is different than the first channel type.

Aspect 5: The method, apparatus, or non-transitory computer-readable medium of any of aspects 3 through 4 where activating the first transistor is based at least in part on biasing the first bit line with the second access voltage being greater than the same voltage and deactivating the second transistor is based at least in part on biasing the second bit line with the same voltage.

Aspect 6: The method, apparatus, or non-transitory computer-readable medium of any of aspects 3 through 4 where activating the first transistor is based at least in part on biasing the first bit line with the second access voltage being less than the same voltage and deactivating the second transistor is based at least in part on biasing the second bit line with the same voltage.

Aspect 7: The method, apparatus, or non-transitory computer-readable medium of any of aspects 1 through 6, further including operations, features, circuitry, logic, means, or instructions, or any combination thereof for reducing, after the accessing, a voltage difference between the conductive pillar and a ground node via a resistive coupling between the conductive pillar and the ground node having a first resistance that is greater than a second resistance associated with the memory cell.

Aspect 8: The method, apparatus, or non-transitory computer-readable medium of any of aspects 1 through 7, further including operations, features, circuitry, logic, means, or instructions, or any combination thereof for isolating, during the accessing, a second conductive pillar from the first bit line based at least in part on deactivating a third transistor between the second conductive pillar and the first bit line and isolating, during the accessing, the second conductive pillar from the second bit line based at least in part on deactivating a fourth transistor between the second conductive pillar and the second bit line.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 9: An apparatus, including: a conductive pillar extending through a plurality of levels of a memory array, where, at each level of the plurality of levels, one or more memory cells of the memory array are coupled between the conductive pillar and a respective word line; a first transistor operable to couple the conductive pillar with a first bit line based at least in part on a first voltage at a gate of the first transistor; and a second transistor operable to couple the conductive pillar with a second bit line based at least in part on a second voltage at a gate of the second transistor.

Aspect 10: The apparatus of aspect 9, where: the first transistor is coupled between the first bit line and a first end of the conductive pillar, and the second transistor is coupled between the second bit line and a second end of the conductive pillar opposite the first end.

Aspect 11: The apparatus of aspect 9, where: the first transistor is coupled between the first bit line and an end of the conductive pillar that is between the one or more memory cells and a substrate, and the second transistor is coupled between the second bit line and the end of the conductive pillar that is between the one or more memory cells and the substrate.

Aspect 12: The apparatus of aspect 9, wherein: the first transistor is coupled between the first bit line and an end of the conductive pillar opposite from a substrate, and the second transistor is coupled between the second bit line and the end of the conductive pillar opposite from the substrate.

Aspect 13: The apparatus of any of aspects 9 through 12, further including: a first gate line coupled with the gate of the first transistor, where the first transistor is operable to couple the conductive pillar with the first bit line based at least in part on the first gate line being biased to the first voltage; and a second gate line coupled with the gate of the second transistor, where the second transistor is operable to couple the conductive pillar with the second bit line based at least in part on the second gate line being biased to the second voltage.

Aspect 14: The apparatus of any of aspects 9 through 13, where the conductive pillar is coupled with a voltage source via a resistive coupling having a first resistance that is greater than a second resistance associated with each of the memory cells.

Aspect 15: The apparatus of aspect 14, where at least a portion of the resistive coupling is connected with the conductive pillar between two levels of the plurality of levels of the memory array.

Aspect 16: The apparatus of any of aspects 9 through 15, where the first transistor is an n-type transistor and the second transistor is a p-type transistor.

Aspect 17: The apparatus of aspect 16, where: for accessing one of the memory cells via the conductive pillar and the first bit line, the apparatus is operable to bias the first bit line with a negative voltage during the coupling of the conductive pillar with the first bit line; and for accessing one of the memory cells via the conductive pillar and the second bit line, the apparatus is operable to bias the second bit line with a positive voltage during the coupling of the conductive pillar with the second bit line.

Aspect 18: The apparatus of aspect 17, where: for accessing the one of the memory cells via the conductive pillar and the first bit line, the apparatus is operable to isolate the conductive pillar from the second bit line; and for accessing the one of the memory cells via the conductive pillar and the second bit line, the apparatus is operable to isolate the conductive pillar from the first bit line.

Aspect 19: The apparatus of any of aspects 9 through 18, where the memory cells each include a chalcogenide storage element.

An apparatus is described. The following provides an overview of aspects of the apparatus as described herein:

Aspect 20: An apparatus, including: a conductive pillar; a word line; a memory cell coupled between the conductive pillar and the word line; a first transistor having a first channel portion coupled between the conductive pillar and a first bit line; a second transistor having a second channel portion coupled between the conductive pillar and a second bit line; and a controller to perform an access operation on the memory cell, the controller operable to cause the apparatus to: couple the conductive pillar with the first bit line based at least in part on activating the first channel portion; isolate the conductive pillar from the second bit line based at least in part on deactivating the second channel portion; bias the word line with a first access voltage; and bias the first bit line with a second access voltage.

Aspect 21: The apparatus of aspect 20, where: to activate the first transistor, the controller is operable to cause the apparatus to bias a first gate portion of the first transistor with a first voltage; and to deactivate the second transistor, the controller is operable to cause the apparatus to bias a second gate portion of the second transistor with a second voltage.

Aspect 22: The apparatus of aspect 21, where the first voltage and the second voltage are a same voltage.

Aspect 23: The apparatus of aspect 22, where: to activate the first transistor, the controller is operable to cause the apparatus to bias the first bit line with the second access voltage being greater than the same voltage; and to deactivate the second transistor the controller is operable to cause the apparatus to bias the second bit line with the same voltage.

Aspect 24: The apparatus of aspect 22, where: to activate the first transistor, the controller is operable to cause the apparatus to bias the first bit line with the second access voltage being less than the same voltage; and to deactivate the second transistor the controller is operable to cause the apparatus to bias the second bit line with the same voltage.

Aspect 25: The apparatus of any of aspects 20 through 24, where, to perform a second access operation on the memory cell, the controller is operable to cause the apparatus to: isolate the conductive pillar with the first bit line based at least in part on deactivating the first channel portion; couple the conductive pillar with the second bit line based at least in part on activating the second channel portion; bias the word line with a third access voltage having a first polarity that is opposite a second polarity of the first access voltage; and bias the second bit line with a fourth access voltage having a third polarity that is opposite a fourth polarity of the second access voltage.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a conductive pillar extending through a plurality of levels of a memory array, wherein, at each level of the plurality of levels, one or more memory cells of the memory array are coupled between the conductive pillar and a respective word line;
a first transistor operable to couple the conductive pillar with a first bit line based at least in part on a first voltage at a gate of the first transistor; and
a second transistor operable to couple the conductive pillar with a second bit line based at least in part on a second voltage at a gate of the second transistor.

2. The apparatus of claim 1, wherein:
the first transistor is coupled between the first bit line and a first end of the conductive pillar, and
the second transistor is coupled between the second bit line and a second end of the conductive pillar opposite the first end.

3. The apparatus of claim 1, wherein:
the first transistor is coupled between the first bit line and an end of the conductive pillar that is between the one or more memory cells and a substrate, and
the second transistor is coupled between the second bit line and the end of the conductive pillar that is between the one or more memory cells and the substrate.

4. The apparatus of claim 1, wherein:
the first transistor is coupled between the first bit line and an end of the conductive pillar opposite from a substrate, and
the second transistor is coupled between the second bit line and the end of the conductive pillar opposite from the substrate.

5. The apparatus of claim 1, further comprising:
a first gate line coupled with the gate of the first transistor, wherein the first transistor is operable to couple the conductive pillar with the first bit line based at least in part on the first gate line being biased to the first voltage; and
a second gate line coupled with the gate of the second transistor, wherein the second transistor is operable to couple the conductive pillar with the second bit line based at least in part on the second gate line being biased to the second voltage.

6. The apparatus of claim 1, wherein the conductive pillar is coupled with a voltage source via a resistive coupling having a first resistance that is greater than a second resistance associated with each of the memory cells.

7. The apparatus of claim 6, wherein at least a portion of the resistive coupling is connected with the conductive pillar between two levels of the plurality of levels of the memory array.

8. The apparatus of claim 1, wherein the first transistor is an n-type transistor and the second transistor is a p-type transistor.

9. The apparatus of claim 8, wherein:
for accessing one of the memory cells via the conductive pillar and the first bit line, the apparatus is operable to bias the first bit line with a negative voltage during the coupling of the conductive pillar with the first bit line; and
for accessing one of the memory cells via the conductive pillar and the second bit line, the apparatus is operable to bias the second bit line with a positive voltage during the coupling of the conductive pillar with the second bit line.

10. The apparatus of claim 9, wherein:
for accessing the one of the memory cells via the conductive pillar and the first bit line, the apparatus is operable to isolate the conductive pillar from the second bit line; and
for accessing the one of the memory cells via the conductive pillar and the second bit line, the apparatus is operable to isolate the conductive pillar from the first bit line.

11. The apparatus of claim 1, wherein the memory cells each comprise a chalcogenide storage element.

12. An apparatus, comprising:
a conductive pillar;
a word line;
a memory cell coupled between the conductive pillar and the word line;

a first transistor having a first channel portion coupled between the conductive pillar and a first bit line;
a second transistor having a second channel portion coupled between the conductive pillar and a second bit line; and
a controller to perform an access operation on the memory cell, the controller operable to cause the apparatus to:
couple the conductive pillar with the first bit line based at least in part on activating the first channel portion;
isolate the conductive pillar from the second bit line based at least in part on deactivating the second channel portion;
bias the word line with a first access voltage; and
bias the first bit line with a second access voltage.

13. The apparatus of claim 12, wherein:
to activate the first transistor, the controller is operable to cause the apparatus to bias a first gate portion of the first transistor with a first voltage; and
to deactivate the second transistor, the controller is operable to cause the apparatus to bias a second gate portion of the second transistor with a second voltage.

14. The apparatus of claim 13, wherein the first voltage and the second voltage are a same voltage.

15. The apparatus of claim 14, wherein:
to activate the first transistor, the controller is operable to cause the apparatus to bias the first bit line with the second access voltage being greater than the same voltage; and
to deactivate the second transistor the controller is operable to cause the apparatus to bias the second bit line with the same voltage.

16. The apparatus of claim 14, wherein:
to activate the first transistor, the controller is operable to cause the apparatus to bias the first bit line with the second access voltage being less than the same voltage; and
to deactivate the second transistor the controller is operable to cause the apparatus to bias the second bit line with the same voltage.

17. The apparatus of claim 12, wherein, to perform a second access operation on the memory cell, the controller is operable to cause the apparatus to:
isolate the conductive pillar with the first bit line based at least in part on deactivating the first channel portion;
couple the conductive pillar with the second bit line based at least in part on activating the second channel portion;
bias the word line with a third access voltage having a first polarity that is opposite a second polarity of the first access voltage; and
bias the second bit line with a fourth access voltage having a third polarity that is opposite a fourth polarity of the second access voltage.

18. A method, comprising:
accessing a memory cell that is coupled between a conductive pillar of a memory die and a word line of the memory die, accessing the memory cell comprising:
coupling the conductive pillar with a first bit line based at least in part on activating a first transistor between the conductive pillar and the first bit line;
isolating the conductive pillar from a second bit line based at least in part on deactivating a second transistor between the conductive pillar and the second bit line;
biasing the word line with a first access voltage; and
biasing the first bit line with a second access voltage.

19. The method of claim 18, wherein:
activating the first transistor is based at least in part on biasing a gate of the first transistor with a first voltage; and
deactivating the second transistor is based at least in part on biasing a gate of the second transistor with a second voltage.

20. The method of claim 19, wherein the first voltage and the second voltage are a same voltage.

21. The method of claim 20, wherein:
the first transistor is associated with a first channel type; and
the second transistor is associated with a second channel type that is different than the first channel type.

22. The method of claim 20, wherein:
activating the first transistor is based at least in part on biasing the first bit line with the second access voltage being greater than the same voltage; and
deactivating the second transistor is based at least in part on biasing the second bit line with the same voltage.

23. The method of claim 20, wherein:
activating the first transistor is based at least in part on biasing the first bit line with the second access voltage being less than the same voltage; and
deactivating the second transistor is based at least in part on biasing the second bit line with the same voltage.

24. The method of claim 18, further comprising:
reducing, after the accessing, a voltage difference between the conductive pillar and a ground node via a resistive coupling between the conductive pillar and the ground node having a first resistance that is greater than a second resistance associated with the memory cell.

25. The method of claim 18, further comprising:
isolating, during the accessing, a second conductive pillar from the first bit line based at least in part on deactivating a third transistor between the second conductive pillar and the first bit line; and
isolating, during the accessing, the second conductive pillar from the second bit line based at least in part on deactivating a fourth transistor between the second conductive pillar and the second bit line.

* * * * *